US007660232B2

(12) United States Patent
Ouyang et al.

(10) Patent No.: US 7,660,232 B2
(45) Date of Patent: Feb. 9, 2010

(54) INTERLEAVER DESIGN WITH COLUMN SKIP FOR IEEE 802.11N STANDARD

(75) Inventors: Xuemei Ouyang, San Jose, CA (US); Chiu Ngo, San Francisco, CA (US)

(73) Assignee: Samsung Electronics Co., Ltd., Suwon (KR)

( * ) Notice: Subject to any disclaimer, the term of this patent is extended or adjusted under 35 U.S.C. 154(b) by 580 days.

(21) Appl. No.: 11/314,929

(22) Filed: Dec. 20, 2005

(65) Prior Publication Data

US 2007/0140100 A1 Jun. 21, 2007

(51) Int. Cl.
*H04J 11/00* (2006.01)
(52) U.S. Cl. ...................... 370/208; 375/260
(58) Field of Classification Search ......... 370/203–208, 370/310, 328, 338; 375/260–268, 340, 343
See application file for complete search history.

(56) References Cited

U.S. PATENT DOCUMENTS

| | | | |
|---|---|---|---|
| 4,394,642 A | 7/1983 | Currie et al. | |
| 5,745,528 A | 4/1998 | Fimoff et al. | |
| 5,987,070 A | 11/1999 | Fimoff et al. | |
| 6,775,335 B2 * | 8/2004 | Sommer et al. | 375/341 |
| 6,901,550 B2 | 5/2005 | Adar et al. | |
| 6,961,388 B2 | 11/2005 | Ling et al. | |
| 7,010,053 B2 | 3/2006 | El-Gamal et al. | |
| 7,127,658 B2 | 10/2006 | Cucchi et al. | |
| 7,154,936 B2 | 12/2006 | Bjerke et al. | |
| 7,284,185 B2 | 10/2007 | Chen | |
| 7,366,249 B2 | 4/2008 | Gresset et al. | |
| 7,397,862 B2 | 7/2008 | Ouyang et al. | |
| 7,523,377 B2 | 4/2009 | Halter | |
| 7,542,410 B2 | 6/2009 | Berkovich | |
| 2002/0131516 A1 | 9/2002 | El-Gamal et al. | 375/285 |
| 2005/0220110 A1 | 10/2005 | Agarwal | |
| 2005/0256821 A1 | 11/2005 | Mishra et al. | |
| 2005/0265469 A1 * | 12/2005 | Aldana et al. | 375/260 |
| 2005/0283705 A1 | 12/2005 | McNamara | |
| 2006/0002486 A1 | 1/2006 | van Nee | |
| 2006/0013330 A1 | 1/2006 | Ha | |
| 2006/0036924 A1 | 2/2006 | Ghosh | 714/755 |
| 2006/0088114 A1 | 4/2006 | Chen et al. | |
| 2006/0088115 A1 | 4/2006 | Chen et al. | |
| 2006/0107171 A1 | 5/2006 | Skraparlis | |

(Continued)

OTHER PUBLICATIONS

U.S. Appl. No. 11/313,403, filed Dec. 20, 2005, X. Ouyang et al.

(Continued)

*Primary Examiner*—Ricky Ngo
*Assistant Examiner*—Kan Yuen
(74) *Attorney, Agent, or Firm*—Kenneth L. Sherman, Esq.; Michael Zarrabian, Esq.; Myers Andras Sherman LLP

(57) ABSTRACT

A MIMO wireless system includes a transmitter having a parser that parses a bit stream into multiple spatial data streams and multiple interleavers corresponding to the multiple spatial data streams, where each interleaver interleaves the bits in the corresponding spatial data stream by performing column skip operation and frequency rotation, to increase diversity of the wireless system. The MIMO wireless system also includes a receiver that has deinterleavers that deinterleaves spatial bit streams transmitted by the transmitter.

23 Claims, 8 Drawing Sheets

U.S. PATENT DOCUMENTS

| | | | |
|---|---|---|---|
| 2006/0120469 | A1 | 6/2006 | Maltsev et al. |
| 2006/0187815 | A1* | 8/2006 | Wallace et al. ............. 370/203 |
| 2006/0227892 | A1 | 10/2006 | Ouyang et al. ............. 375/267 |
| 2006/0274687 | A1 | 12/2006 | Kim |
| 2007/0067696 | A1 | 3/2007 | Bhatt et al. |
| 2007/0110178 | A1* | 5/2007 | Su et al. .................. 375/260 |
| 2007/0140103 | A1 | 6/2007 | Ouyang et al. |
| 2007/0147521 | A1 | 6/2007 | Horng et al. |

OTHER PUBLICATIONS

U.S. Appl. No. 11/292,851, filed Dec. 1, 2005, X. Ouyang et al.

U.S. Appl. No. 11/104,808, filed Apr. 12, 2005, X. Ouyang et al.

S.A. Mujtaba, "TGn Sync Proposal Technical Specification," doc.: IEEE 802.11 11-04/889r1, Nov. 2004, pp. 1-143.

Aziz, M.K.A. et al. *A study of performance and complexity for IEEE 802.11n MIMO-OFDM GIS solutions*. In: Communications, 2004 IEEE International Conference on. New York: IEEE, 2004, vol. 7, pp. 3822-3826.

S.A. Mujtaba, "TGn Sync Proposal Technical Specification," doc.: IEEE 802.11-04/889r0, Aug. 2004, pp. 1-135.

Singh, et al., "WWiSE Proposal: High throughput extension to the 802.11 Standard," doc.: IEEE 802.11-04/0886r4, Nov. 2004, pp. 1-80.

Kose, et al., "WWiSE Proposal: High throughput extension to the 802.11 Standard," doc.: IEEE 802.11-05/0149r2, Mar. 2005, pp. 1-93.

S.A. Mujtaba, "TGn Sync Proposal Technical Specification," doc.: IEEE 802.11-04/0889r7, Jul. 2005, pp. 1-133.

Naguib, et al., "Inceasing Date Rate Over Wireless Channels," Signal Processing Magazine, IEEE, May 2000, pp. 76-92.

S.A. Mujtaba, "TGn Sync Proposal Technical Specification," doc.: IEEE 802.11-04/0889r4, Mar. 2005, pp. 1-162.

International Search Report for International Application No. PCT/KR2006/005555 from Korean Intellectual Property Office dated Mar. 20, 2007, 3 pgs.

Written Opinion of the International Search Authority for International Application No. PCT/KR2006/005555 from Korean Intellectual Property Office dated Mar. 20, 2007, 4 pgs.

International Search Report for International Application No. PCT/KR2006/005133 from Korean Intellectual Property Office dated Feb. 26, 2007, 3 pgs.

Written Opinion of the International Searching Authority for International Application No. PCT/KR2006/005133 from Korean Intellectual Property Office dated Feb. 26, 2007, 3 pgs.

S.A. Mujtaba, "TGm Sync Proposal Technical Specification," doc.: IEEE 802.11 11-04/889r2, Jan. 2005, pp. 1-151.

U.S. Non-Final Office Action for U.S. Appl. No. 11/104,808 mailed on Jan. 24, 2008.

U.S. Non-Final Office Action for U.S. Appl. No. 11/104,808 mailed on Jul. 21, 2008.

U.S. Final Office Action for U.S. Appl. No. 11/104,808 mailed on Jan. 6, 2009.

U.S. Advisory Action for U.S. Appl. No. 11/104,808 mailed on Apr. 6, 2009.

U.S. Notice of Allowance for U.S. Appl. No. 11/253,855 mailed on Mar. 4, 2008.

U.S. Non-Final Office Action for U.S. Appl. No. 11/317,409 mailed on Nov. 13, 2008.

U.S. Final Office Action for U.S. Appl. No. 11/317,409 mailed on May 1, 2009.

U.S. Final Office Action for U.S. Appl. No. 11/292,851 mailed on Oct. 16, 2008.

U.S. Final Office Action for U.S. Appl. No. 11/292,851 mailed on Mar. 31, 2009.

U.S. Non-Final Office Action for U.S. Appl. No.11/314,925 mailed Oct. 15, 2008.

U.S. Final Office Action for U.S. Appl. No.11/314,925 mailed Apr. 13, 2009.

* cited by examiner

INTERLEAVER DESIGN WITH COLUMN SKIP FOR IEEE 802.11N STANDARD

FIELD OF THE INVENTION

The present invention relates generally to data communication, and more particularly, to data communication with transmission diversity using Orthogonal Frequency Division Multiplexing (OFDM) in multiple antenna channels.

BACKGROUND OF THE INVENTION

In wireless communication systems, antenna diversity plays an important role in increasing the system link robustness. OFDM is used as a multiplexing technique for transmitting digital data using radio frequency signals (RF). In OFDM, a radio signal is divided into multiple sub-signals that are transmitted simultaneously at different frequencies to a receiver. Each sub-signal travels within its own unique frequency range (sub-channel), which is modulated by the data. OFDM distributes the data over multiple channels, spaced apart at different frequencies.

OFDM modulation is typically performed using a transform such as Fast Fourier Transform (FFT) process wherein bits of data are encoded in the frequency-domain onto sub-channels. As such, in the transmitter, an Inverse FFT (IFFT) is performed on the set of frequency channels to generate a time-domain OFDM symbol for transmission over a communication channel. The IFFT process converts the frequency-domain data for each sub-channel into a block of time-domain samples which are later on converted to an analogue modulating signal for an RF modulator. In the receiver, the OFDM signals are processed by performing an FFT process on each symbol to convert the time-domain data into frequency-domain data, and the data is then decoded by examining the phase and amplitude of the sub-channels. Therefore, at the receiver the reverse process of the transmitter is implemented. Further, transmission antenna diversity schemes are used to improve the OFDM system reliability. Such transmit diversity schemes in OFDM systems are encoded in the frequency-domain as described.

OFDM has been selected as the basis for the high speed wireless local area network (WLAN) standards by the IEEE 802.11a standardization group, and is also being considered as the basis for the high throughput WLAN 802.11n. A typical transmitter for a conventional OFDM MIMO system implementing WLAN 802.11n comprises a channel encoder, a puncturer, a spatial parser, and multiple data stream processing paths. Each data stream processing path comprises an interleaver, a constellation mapper, an IFFT function, and guard interval insertion window and an RF modulator.

For parser and interleaver portion of the system, coded and punctured bits are interleaved across spatial streams and frequency tones. There are two steps to the space-frequency interleaving: spatial stream parsing and frequency interleaving. First, encoded and punctured bits are parsed to multiple spatial streams by a round-robin parser. The parser sends consecutive blocks of bits to different spatial streams in a round-robin fashion starting with the first spatial stream. Second, all encoded bits are interleaved by a separate block interleaver for each spatial stream, with a block size corresponding to the number of bits in a single OFDM symbol. The block interleavers are based on the 802.11a interleaver, with certain modifications to allow for multiple spatial streams and 40 MHz transmissions.

The interleaver is defined by a two-step permutation. The first permutation ensures that adjacent coded bits are mapped onto nonadjacent subcarriers. The second permutation ensures that coded bits are mapped alternately onto less and more significant bits of the constellation and thereby long runs of low reliability (LSB) bits are avoided. A deinterleaver in a receiver performs the inverse operation, and is also defined by two permutations corresponding to the two interleaver permutations.

Such a conventional system provides write in block, one column rotation for multiple antennas transmission, and PAM order rotation within a column. However, because the columns are rotated by only one column, adjacent bits are only 3 and 6 sub-carriers apart for 20 MHz and 40 MHz systems, respectively. As a result, in a correlated channel, the diversity gain is not fully utilized.

Another conventional transmitter design includes a channel encoder, a puncturer, a frequency interleaver, a spatial parser, and two data stream processing paths. Each data stream processing path comprises a constellation mapper, an IFFT function, a guard interval insertion window and an RF modulator. The interleaver performs interleaving on two consecutive OFDM symbols before they are parsed onto two different antennas. An example mathematical relation for the first permutation is:

$$i = N_{row} \times (k \bmod N_{column}) + \mathrm{floor}(k/N_{column})$$

where $N_{column}=32$, $N_{row}=2N_{CBPS}/N_{column}$

After the interleaving, the spatial parser parses the interleaved bits in group by a round robin fashion to different spatial streams. The group size equals the number of bits in one QAM symbol. For example, for 64 QAM, 6 bits are parsed onto one spatial stream and the next 6 bits are parsed onto another spatial stream. However, such a transmitter is not flexible enough to accommodate different channel coding and modulation schemes on different special streams.

BRIEF SUMMARY OF THE INVENTION

In one embodiment, the present invention provides an interleaver design for a transmitter that is flexible enough to accommodate different channel coding and modulation schemes on different special streams.

Accordingly, a MIMO wireless system according to an embodiment of the present invention includes a transmitter having a parser that parses a bit stream into multiple spatial data streams and multiple interleavers corresponding to the multiple spatial data streams, where each interleaver interleaves the bits in the corresponding spatial data stream by performing column skip read out and frequency rotation operation, to increase diversity of the wireless system. The MIMO wireless system also includes a receiver that has deinterleavers that deinterleave spatial bit streams transmitted by the transmitter.

These and other features, aspects and advantages of the present invention will become understood with reference to the following description, appended claims and accompanying figures.

DETAILED DESCRIPTION OF THE INVENTION

In one embodiment, the present invention provides a method of bit stream interleaving for a MIMO system that implements the IEEE 802.11n standard. An example 802.11n system is described in S. A. Mutjaba, "TGn Sync Proposal Technical Specification," a contribution to IEEE. 802.11-04/889r1, November 2004 (incorporated herein by reference). The interleaving method increases the column rotation within a block, and unifies row and column rotation by a frequency rotation, to better explore the diversity of the wireless system.

Figure 1A:
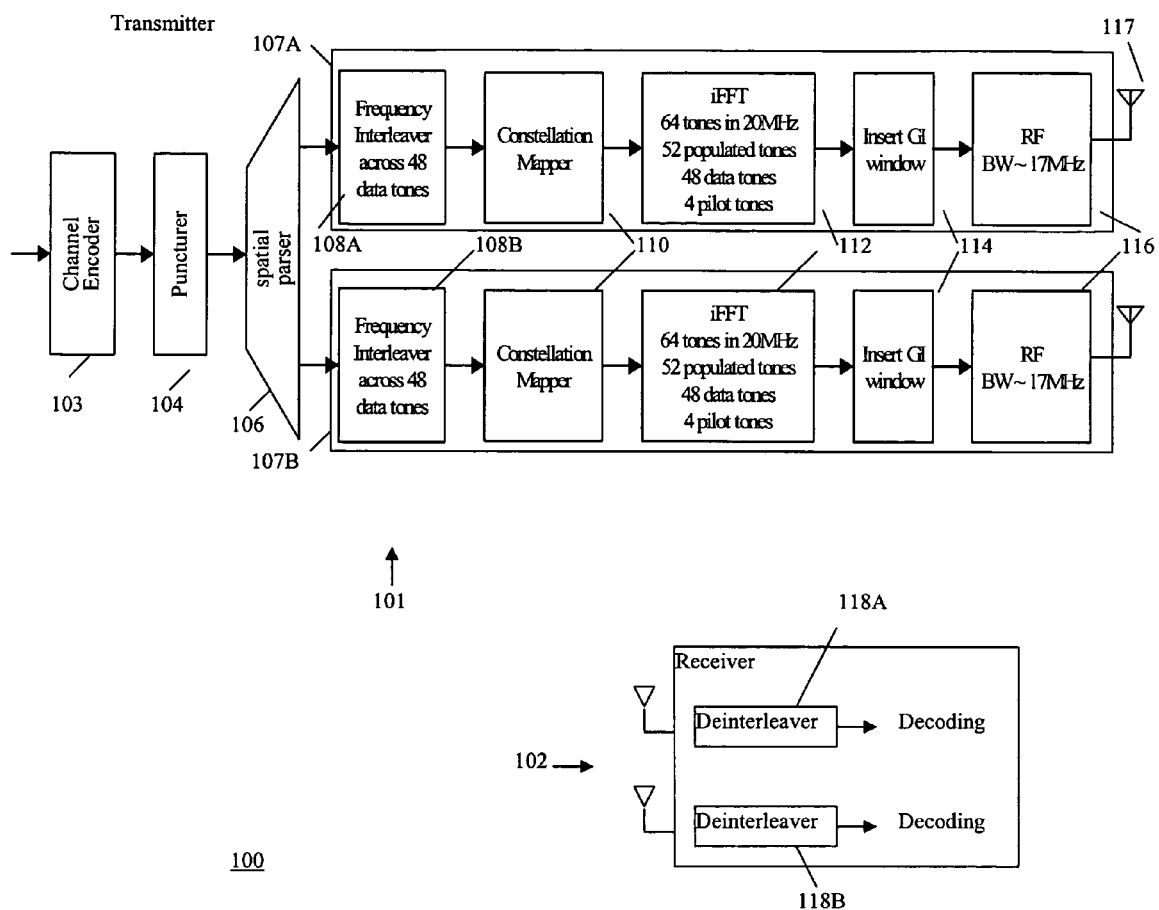
FIG. 1A shows a functional block diagram of an embodiment of an OFDM MIMO transmitter having a transmitter data path for 2-antenna MIMO in a 20 MHz channel, according to the present invention.

FIG. 1A shows an example block diagram of an OFDM MIMO system 100 (e.g., 20 MHz channel) implementing WLAN 802.11n, according to an embodiment of the present invention. The system 100 includes a transmitter 101 and a receiver 102. The transmitter 101 comprises a channel encoder 103, a puncturer 104, a spatial parser 106, and two data stream processing paths 107A and 107B. Each data stream processing path comprises an interleaver (e.g., interleaver 108A for a first processing path 107A, and interleaver 108B for a second processing path 107B), a constellation mapper 110, an IFFT function 112, and guard-interval insertion window 114 and an RF modulator 116. For the parser 106 and the interleavers 108A, 108B portions of the transmitter, coded and punctured bits are interleaved across spatial streams and frequency tones. There are two steps to the space-frequency interleaving: spatial stream parsing and frequency interleaving.

Conventionally, encoded and punctured bits are parsed to multiple spatial streams by a round-robin parser where $$s = \max\{N_{BPSC}/2, 1\} \quad (1)$$

such that s is the number of bit parsed onto one antenna each round, and $N_{BPSC}$ is the number of coded bits per subcarrier. A conventional parser sends consecutive blocks of s bits to different spatial streams in a round-robin fashion starting with the first spatial stream. All encoded bits are conventionally interleaved by a separate block interleaver for each spatial stream, with a block size corresponding to the number of coded bits in a single OFDM symbol, $N_{CBPS}$. The conventional block interleavers are based on the 802.11a interleaver, with certain modifications to allow for multiple spatial streams and 40 MHz transmissions.

The basic interleaver array has $N_{row}$ rows and $N_{column}$ columns and $N_{BPSC}$ the number of coded bits per subcarrier (e.g. $N_{BPSC}=1$ for BPSK, 2 for QPSK, 4 for 16 QAM, etc), wherein the interleaver parameters are shown in Table 1 below.

TABLE 1

| Interleaver Parameters | | |
|---|---|---|
| | $N_{column}$ | $N_{row}$ |
| 20 MHz channels | 16 | 3 $N_{BPSC}$ |
| 40 MHz channels | 18 | 6 $N_{BPSC}$ |

A conventional interleaver is defined by a two-step permutation. The first-step permutation (first permutation) ensures that adjacent coded bits are mapped onto nonadjacent subcarriers. The first permutation is modified from the 802.11a interleaver such that the column indexes in the array are rotated by one column for each spatial stream. The second-step permutation (second permutation) ensures that coded bits are mapped alternately onto less and more significant bits of the constellation and thereby long runs of low reliability (LSB) bits are avoided.

Relations (2) and (3) below define a conventional interleaver, wherein the index of the coded bit before the first permutation is denoted by k, and i is the index after the first and before the second permutation. In the conventional interleaver, the first permutation is defined by relation (2) below:

$$i = N_{row} \times (((k \bmod N_{column}) + i_{SS}) \bmod N_{column}) + \mathrm{floor}(k/N_{column}), k=0, 1, \ldots, N_{CBPS}-1, \quad (2)$$

where $i_{SS}=0, 1, \ldots, N_{SS}-1$, is the index of the spatial stream on which this interleaver is operating. The insertion of $i_{SS}$ is a modification of the 802.11a interleaver. This results in a "column offset" in the de-interleaving process. That is, bits are read in by rows and out by columns, but starting with column $i_{SS}$ in a column-cyclic fashion.

Further, conventionally the second permutation is defined by relation (3) below, wherein j is the index after the second permutation, just prior to modulation mapping:

$$j = s \times \mathrm{floor}(i/s) + (i + N_{CBPS} - \mathrm{floor}(N_{column} \times i/N_{CBPS})) \bmod s, i=0, 1, \ldots, N_{CBPS}-1, \quad (3)$$

where s is determined according to relation (4) below:

$$s = \max(N_{BPSC}/2, 1). \quad (4)$$

Similarly, a deinterleaver in a receiver performs the inverse relation, and is defined by a first-step permutation and a second-step permutation corresponding to the conventional interleaver permutations above. Relations (5) and (6) define these first and second permutations for a conventional deinterleaver, wherein the index of the original received bit before the first permutation is denoted by j, and i is the index after the first and before the second permutation.

Conventionally, the first permutation in the deinterleaver is defined by relation (5) below:

$$i = s \times \mathrm{floor}(j/s) + (j + \mathrm{floor}(N_{column} \times j/N_{CBPS})) \bmod s, j=0, 1, \ldots, N_{CBPS}-1, \quad (5)$$

where s is as defined in relation (4) above. The first permutation in relation (5) is the inverse of the first permutation in relation (3) above.

Conventionally, the second permutation in the deinterleaver is defined by relation (6) below, where k is the index after the second permutation:

$$k = N_{column}(i \bmod N_{row}) + (\mathrm{floor}(i/N_{row}) - i_{ss} + N_{column}) \bmod N_{column}, i=0, 1, \ldots, N_{CBPS}-1. \quad (6)$$

The second permutation in relation (6) is the inverse of the interleaver permutation in relation (2) above.

As noted, the conventional system provides write in block, column rotation for multiple antennas transmission, and PAM order rotation within a column. However, because the columns are rotated by only one column, adjacent bits are only 3 and 6 sub-carriers apart for 20 MHz and 40 MHz systems, respectively. As a result, in a correlated channel, the diversity gain is not fully utilized.

In the commonly assigned patent application Ser. No. 11/104,808, filed on Apr. 12, 2005, an improved interleaving process is described which increases the column rotation to the largest possible distance within a block to fully explore the diversity of the wireless system. In such improved interleaving process, in a first permutation, the column rotation is changed from one column rotation to $((N_{column}/N_{ss}) \times i_{ss})$ column rotations, where $N_{ss}$ is the total number of spatial data streams and $i_{ss}$ is index of spatial data stream which ranges from 0 to $N_{ss}-1$. As such, in contrast to the conventional interleaving relation (2) above, the first permutation in the improved interleaving process is defined by relation (7) below:

$$i = N_{row} \times (((k \bmod N_{column}) + \text{floor}(N_{column}/N_{ss}) \times i_{SS}) \bmod N_{column} + \text{floor}(k/N_{column})) \text{ where } k = 0, 1, \ldots, N_{CBPS}-1. \quad (7)$$

On the receiver side, a deinterleaving process performs the reverse operation for de-interleaving the received bits. In contrast to the conventional deinterleaving relation (6) above, the second permutation in the deinterleaver is defined by relation (8) below:

$$k = N_{column} \times (i \bmod N_{row}) + (\text{floor}(i/N_{row}) - \text{floor}(N_{column}/N_{ss}) \times i_{ss} + N_{column}) \bmod N_{column} \text{ wherein } i = 0, 1, \ldots, N_{CBPS}-1. \quad (8)$$

For example, if two data streams are to be transmitted, using the improved interleaving process. The adjacent data bits are separated 8 columns apart for different data streams in a 20 MHz channel. In another example, the adjacent data bits are separated 9 columns apart for different data streams in a 40 MHz channel.

In one example transmitter where there are multiple spatial streams, a block of bits in first data stream is transmitted without any rotation in that block. Conventionally, each remaining spatial stream is transmitted after $i_{ss}$ column rotation relative to the first spatial stream. However using the improved interleaving process, each remaining spatial stream is transmitted after multiple column rotations, wherein the number of rotations is the number of columns in the interleaver array divided by the number of spatial streams.

In another example transmitter where there are two spatial streams, and one spatial stream is transmitted over a first antenna, and the other over a second antenna, a first block of bits is transmitted over the first antenna without any rotation in that block. Conventionally, for the second antenna, data is transmitted with one column rotation where the second column is rotated to the first column, and so one, so that all the columns are shifted/rotated left by one column. Using the improved, however, for the second antenna, the number of rotations is the number of columns in the interleaver array divided by the number of spatial streams. For example, for a 20 MHz transmitter having two antennas, the interleaver array comprises 16 columns and three rows of bits. Using the improved interleavers, for the second antenna the number of rotations is the number of columns (16) divided by the number of spatial streams (2), resulting in 8 column rotations. As such, columns 9 through 16 are shifted into the first part (first 8 columns) of the array block, and columns 1 through 8 are shifted into the second part (second 8 columns) of the array block for transmission.

The MIMO system performance (e.g., throughput) using multiple column rotation interleaving in the improved interleavers is improved in comparison to a conventional system with one column rotation interleaving. This is because in OFDM different subcarriers are used and when bits are rotated by multiple columns, adjacent bits are separated further in the spatial domain and in the subcarrier space, reducing fading in transmission channels.

Using multiple column rotation according to the improved interleaving process, two adjacent bits have less probability of seeing the same channel. As such, in the receiver when the received data bits are de-interleaved for convolution decoding, if one received bit has low energy (bad bit) because of transmission in a fading channel, and an adjacent bit has high energy (good bit), the good bit can be used to recover the bad bit by convolution decoding.

With the conventional one column rotation interleaving, the adjacent data bits are spatially close and can face the same bad transmission channel. In a case where there are several continuous bits that face the same bad channel, it is difficult for the receiver to recover the bits by convolution decoding. However, with multiple column rotation in the improved interleaving process, adjacent bits are spatially separated such that they are less likely to be transmitted in the same bad/fading channel. As such, if a bit is transmitted in a bad channel, and the adjacent bits are transmitted via good channels, decoding in the receiver can still recover the bit transmitted via the bad channel using the bits transmitted in the good channels.

In the commonly assigned patent application entitled: "An improved interleaver design for IEEE 802.11n standard", Ser. No. 11/292,851 (incorporated herein by reference), to further separate adjacent bits into different sub-band and different spatial stream, in addition to larger column rotation an additional row rotation is performed on different spatial streams, which result in the change of relation (2) above to relation (10) below (Ncol is equivalent to Ncolumn):

$$i = N_{row} * (((k \bmod N_{col}) + \text{floor}(N_{col}/N_{ss}) * i_{ss}) \bmod N_{col}) + (\text{floor}(k/N_{col}) + \text{ceil}(N/N_{ss} * i_{ss}) * N_{BPSC}) \bmod N_{row} \quad (10)$$

where $k=0, 1, \ldots N_{CBPS}-1$, and
$i_{ss}=0, \ldots, N_{ss}-1$ where $N_{ss}$ is the number of spatial data streams.

Accordingly, the corresponding deinterleaving relation is modified into relation (11) below, as:

$$k = (N_{col} * (i \bmod N_{row}) + (\text{floor}(i/N_{row} - \text{floor}(N_{col}/N_{ss}) * i_{ss}) \bmod N_{col} + N_{col} * (N - \text{ceil}(N/N_{ss} * i_{ss})) * N_{BPSC}) \bmod N_{CBPS}, \quad (11)$$

wherein $i=0, 1, \ldots N_{CBPS}-1$,
$i_{ss}=0 \ldots N_{ss}-1$, where $N_{ss}$ is the number of spatial data streams.

In the commonly assigned patent application entitled: "An improved interleaver for IEEE 802.11n standard", Ser. No. 11/313,403 (incorporated herein by reference), to further separate adjacent bits into different sub-band and different spatial stream, in addition to larger column rotation an additional row rotation with unification of row and column rotation by a frequency rotation is performed on different spatial streams. The interleaver is implemented in three steps according to relations (12) through (14) below:

$$i = N_{row} \times (k \bmod N_{column}) + \text{floor}(k/N_{column}),$$
$$k=0, 1, \ldots, N_{CBPS}-1, \quad (12)$$

$$j = s \times \text{floor}(i/s) + (i + N_{CBPS} - \text{floor}(N_{column} \times i/N_{CBPS})) \bmod s, i=0, 1, \ldots, N_{CBPS}-1, \quad (13)$$

where $s = \max(N_{BPSC}/2, 1)$ $$r = (j - ((2 \times i_{ss}) \bmod 3 + 3 \times \text{floor}(i_{ss}/3)) \times N_{rot} \times N_{BPSC}) \bmod N_{CBPS}, j=0, 1, \ldots, N_{CBPS}-1 \quad (14)$$

where $i_{SS}=0, 1, \ldots, N_{SS}-1$ is the index of the spatial stream on which this interleaver is operating, and $N_{rot}$ is a base rotation number in use. We choose $N_{rot}$ equal to 11 and 29 for 20 MHz and 40 MHz operation, respectively.

The corresponding deinterleaver operation is according to relations (15) through (17) below:

$$x_d = (x_{dd} + ((2 \times i_{ss}) \bmod 3 + 3 \times \text{floor}(i_{ss}/3)) \times N_{rot} \times N_{BPSC}) \bmod N_{CBPS} \quad (15)$$

where $x_{dd} = 0, 1, \ldots, N_{CBPS}-1$ $$j_d s \times \text{floor}(j_{dd}/s) + (j+\text{floor}(N_{column} \times j_{dd}/N_{CBPS})) \mod s\, j_{dd} = 0, 1, \ldots, N_{CBPS}-1, \quad (16)$$

$$i_d N_{column} \times i_{dd} - (N_{CBPS}-1) \times \text{floor}(N_{column} \times i_{dd}/N_{CBPS}), i_{dd} = 0, 1, \ldots, N_{CBPS}-1, \quad (17)$$

wherein $i_{dd}, j_{dd}$ represent the index before operation of each step accordingly, the index of the coded bit before the first permutation is denoted by $x_{dd}$, before the second permutation and after the first permutation by $j_{dd}$ and before third permutation and after second permutation by $i_{dd}$, and $x_d$ is the index after the first and before the second permutation, and $j_d$ is the index after the second permutation and before the third permutation, and $i_d$ is the index after the third permutation.

Improved Interleaver/Deinterleaver

According to the present invention, a further improved interleaving process provides higher diversity gain, improving performance of the MIMO system. In the following description, an example MIMO system including a transmitter and a receiver, with 2 data streams and BPSK in 20 MHz channelization is described. However, those skilled in the art will recognize that principles of the present invention can implemented in systems with more than 2 data streams and different modulations.

In the example transmitter 101 of FIG. 1A, an embodiment of the improved interleaving process according to the present invention is implemented in the interleavers 108A, 108B wherein the interleaving process includes three general steps. Interleaving the bits in each spatial data stream by performing a column skip readout operation and frequency rotation on all the data streams except a first one, to increase diversity of the wireless system, is described by the example steps below.

Step 1: The bits in the interleaver array are written in by row, and read out by column. This step includes a column skip operation. Generally, the read out order of the block interleaver is from the first column to the last column and progresses one column as a step size. In column skip operation, however, the column read out order from the block is no longer progressive. After read out of the first column, instead of read out of the second column, the kth column in the block is read out. The same rule is applied to all of the columns. For example, after the data bits are written in the interleaver block, instead of reading out the bits from column 0 1 2 3 ... etc., the bits are read out from columns 0, k, 1, k+1, 2, k+2, ... or k, 0, k+1, 1, k+2, 2, ..., where k is selected as the column-skip. In this embodiment, k is the largest separation of the adjacent bits. As such, k can be different for different number of data streams. In the following example, k is selected as 8, which is the middle column of the block interleaver array.

As such, for the example transmitter 101 in FIG. 1A, for the first data stream path (i.e., first transmission path 107A), the write-in input bit indices include:

| 0  | 1  | 2  | 3  | 4  | 5  | 6  | 7  | 8  | 9  | 10 | 11 | 12 | 13 | 14 | 15 |
|----|----|----|----|----|----|----|----|----|----|----|----|----|----|----|----|
| 16 | 17 | 18 | 19 | 20 | 21 | 22 | 23 | 24 | 25 | 26 | 27 | 28 | 29 | 30 | 31 |
| 32 | 33 | 34 | 35 | 36 | 37 | 38 | 39 | 40 | 41 | 42 | 43 | 44 | 45 | 46 | 47 |

The read-out bits indices include:

| 8 24 40 | 0 16 32 | 9 25 42 | 1 17 33 | ... |
|---------|---------|---------|---------|-----|
| 15 31 47 | 7 23 39 | | | |

Further, for the second data stream path 107B of the example transmitter 101 in FIG. 1A, the write-in bit indices are the same as shown above, and the read out bits indices include:

| 0 16 32 | 8 24 40 | 1 17 33 | 9 25 42 |
|---------|---------|---------|---------|
| ... | 7 23 39 | 15 31 47 | |

Step 1 is performed on all data streams.

Step 2: Thereafter, frequency rotation is performed on the data for the second data stream path 107B (e.g., second transmission path with 22 subcarriers), and remaining data paths. The aforementioned commonly assigned patent application entitled: "An improved interleaver for IEEE 802.11n standard", Ser. No. 11/313,403 (incorporated herein by reference), describes an example of such frequency rotation to further separate adjacent bits into different sub-band and different spatial stream, wherein in addition to larger column rotation an additional row rotation with unification of row and column rotation by a frequency rotation is performed on different spatial streams. This is illustrated by subcarrier index as follows:

Original order of the data on the subcarrier:

0 1 2 3 4 5 6 7 8 9 10 11 12 13 14 15 16 17 18 19 20 21 22
23 24 25 26 27 28 29 30 ... 48

Order of the data on the subcarrier after the frequency rotation:

23 24 25 ... 48 0 1 2 3 4 ... 22

Step 3: Thereafter, PAM order rotation is performed as described in IEEE 802.11a standard as the second permutation.

As those skilled in the art will recognize, the deinterleaver operation in deinterleavers 118A, 118B of a receiver 102 is the reverse operation of the interleaver operation described above.

Figure 1B:
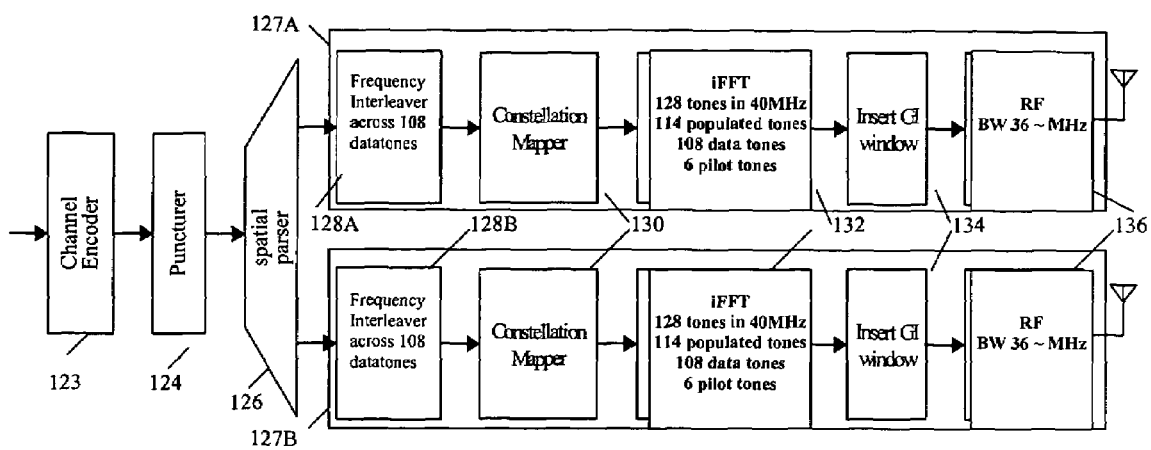
FIG. 1B shows a functional block diagram of an embodiment of an OFDM MIMO transmitter having a transmitter data path for 2-antenna MIMO in a 40 MHz channel, according to the present invention.

FIG. 1B shows a functional block diagram of an embodiment of an OFDM MIMO transmitter 120 having a transmitter data path for 2-antenna MIMO in a 40 MHz channel, according to the present invention. The transmitter 120 comprises a channel encoder 123, a puncturer 124, a spatial parser 126, and two data stream processing paths 127A, 127B. Each data stream processing path comprises an interleaver (e.g., interleaver 128A for a first processing path 127A, and interleaver 128B for a second processing path 127B), a constellation mapper 130, an IFFT function 132, and guard interval insertion window 134 and an RF modulator 136. For the parser 126 and the interleavers 128A, 128B portions of the transmitter, coded and punctured bits are interleaved across spatial streams and frequency tones. The interleavers 128A and 128B implement an embodiment of said further improved interleaving process according to the present invention as described herein.

Figure 2:
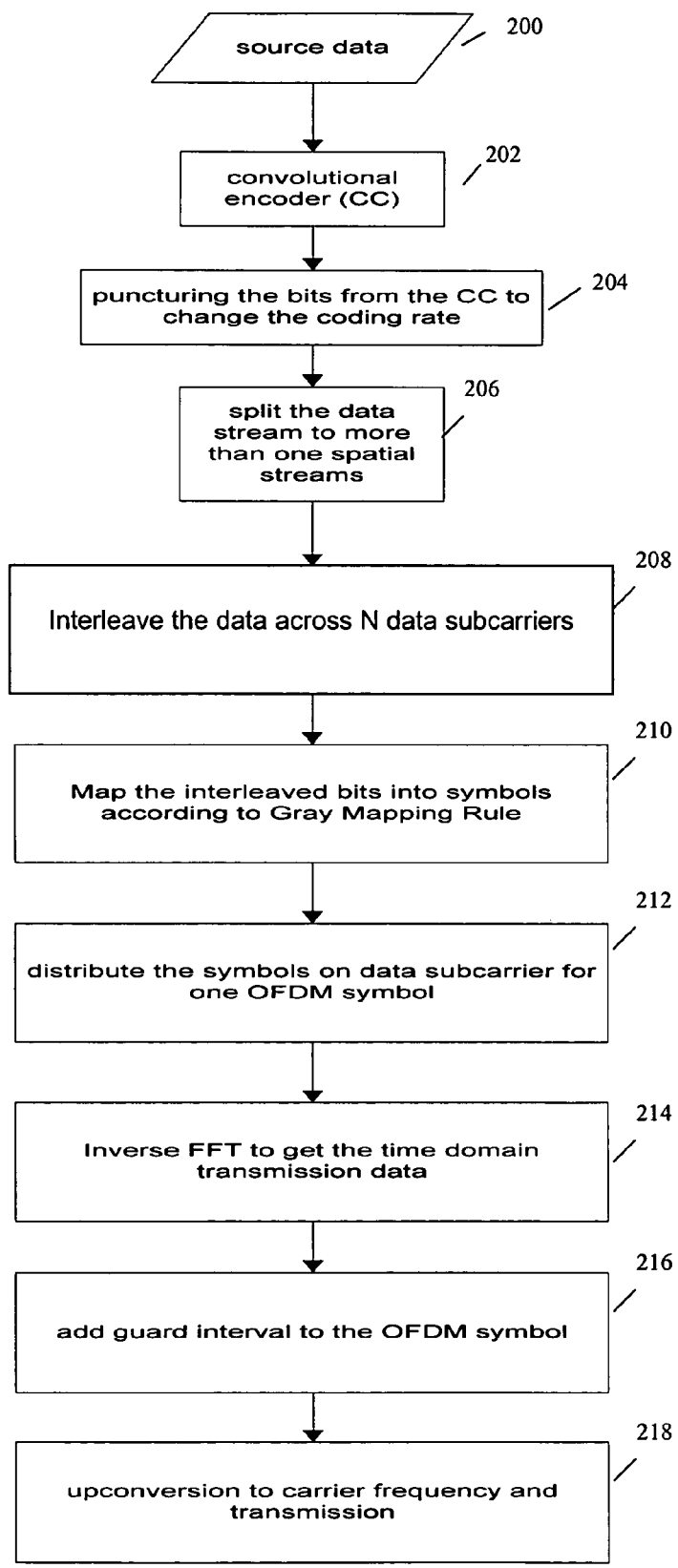
FIG. 2 shows a flowchart of the steps of an embodiment of an interleaving process in a MIMO transmitter according to the present invention.

FIG. 2 shows a flowchart of the steps of example operation of the transmitter 101 of FIG. 1A (or transmitter of FIG. 1B) according to an embodiment of said further improved interleaving process provided by the present invention. According to the example in FIG. 2, the transmitter 101 of FIG. 1A operates according to the steps of: source bit stream is received (step 200); the channel encoder 103 encodes data using convolutional encoding (CC) (step 202); the puncturer 104 punctures the bits from the CC to change the coding rate (step 204); the spatial parser 106 separates the data stream into several spatial streams (step 206); then in the processing paths 107A and 107B, the interleavers 108A and 108B interleave the bits as described above (step 208); the constellation mapper 110 groups/maps the interleaved bits into symbols using a Gray Mapping Rule (e.g., BPSK groups 1 bit into one symbol; 64 QAM groups 6 bits into one symbol, etc.) (step 210); the symbols are distributed on data subcarrier of one OFDM symbol by an IFFT operation wherein the data symbols are mapped onto each subcarrier for IFFT (step 212); the IFFT function 112 converts the frequency domain data to time domain transmission data (step 214); the guard window 114 adds guard interval to each OFDM symbol in time domain, to prevent inter symbol interference (step 216); and in the RF modulator 116 the signal is RF modulated and transmitted through the strongest channel via antennas 117 (step 218).

Figure 3:
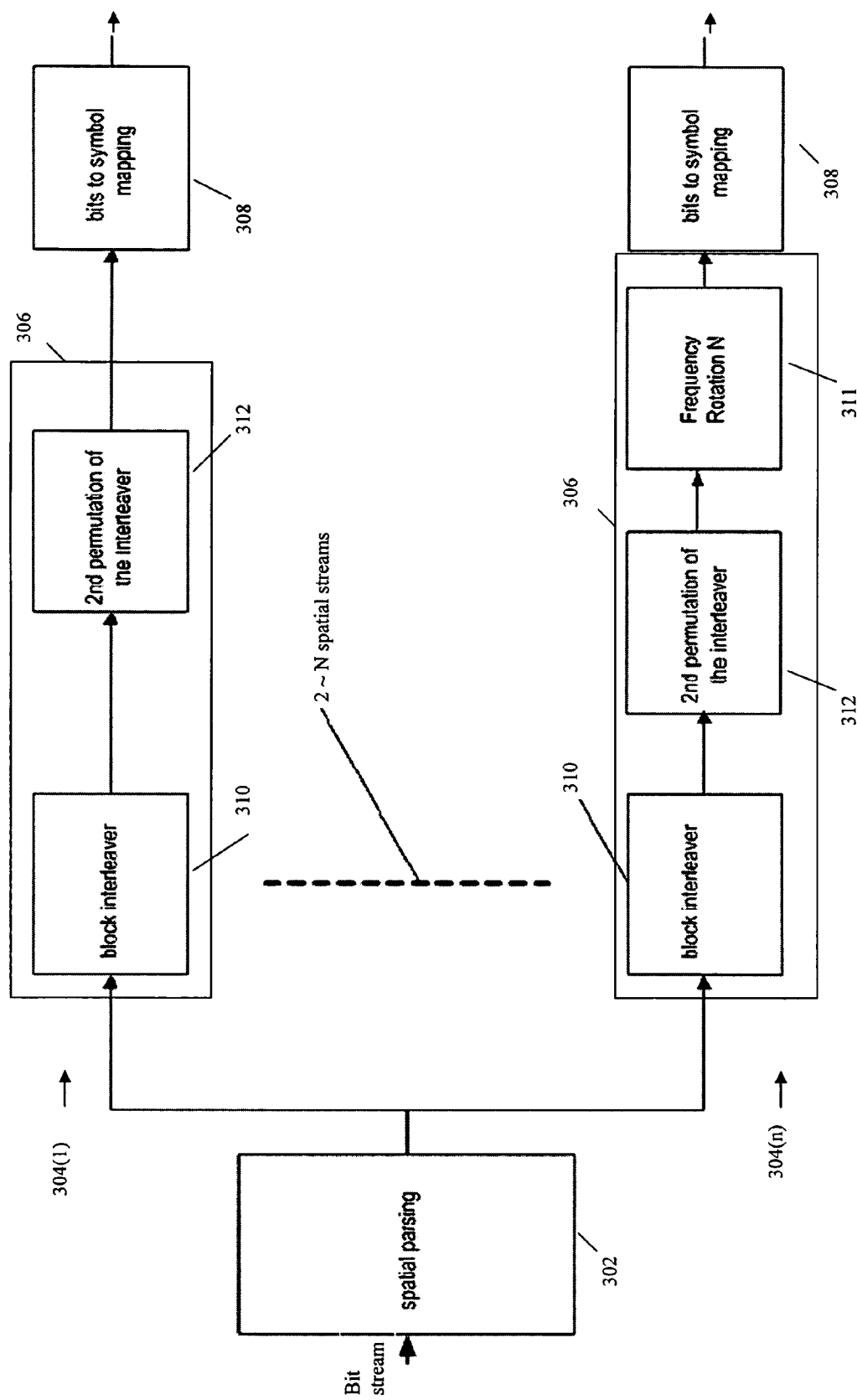
FIG. 3 shows a functional block diagram of example interleavers according to another embodiment of the present invention.

FIG. 3 shows a more detailed block diagram of a transmitter 300 utilizing an interleaving process for multiple spatial stream paths, according to another embodiment of the present invention. The transmitter 300 includes a spatial parser 302, and multiple spatial stream processing paths 304(1) through 304(n). Each of the paths 304(1)-304(n) includes an interleaver 306 and a bit to symbol mapper 308. Each interleaver comprises a block first permutation interleaver 310, and a second permutation interleaver 312. The block interleaver 310 for the first path 304(1) implements an embodiment of column skip read out scheme according to the present invention.

For different spatial streams 304(2)-304(n) beyond the first spatial stream processing path 304(1), the interleavers 310 implement: IEEE 802.11a interleaving and an N-frequency rotation is performed by a frequency rotation block 311 (the above-mentioned commonly assigned "An improved interleaver for IEEE 802.11n standard", Ser. No. 11/313,403, incorporated herein by reference, provides an implementation for the frequency rotation interleavers 311).

After spatial parsing of the input bit stream into multiple spatial streams by the parser 302, each spatial stream is processed in a corresponding spatial stream processing path 304(1)-304(n). Then, the bits processed in each of the spatial stream paths 304(1)-304(n) are transmitted via a channel (e.g., as in system 100 of FIG. 1A).

As noted, in the example of FIG. 3, the interleaver 306 in each spatial stream path comprises a block (first permutation) interleaver 310 and a second permutation interleaver 312. The block interleavers 310 for the first stream path 304(1) is configured according to the present invention such that the block interleaver 310 for the first stream path 304(1) implements the column skip read out scheme. The block interleavers 310 for the remaining stream paths 304(2)-304(n) implement the column skip read out operation also with different skip starting point as illustrated above, while a third step of frequency rotation is applied in rotation blocks 311 of the remaining paths 304(2)-304(n).

Figure 4:
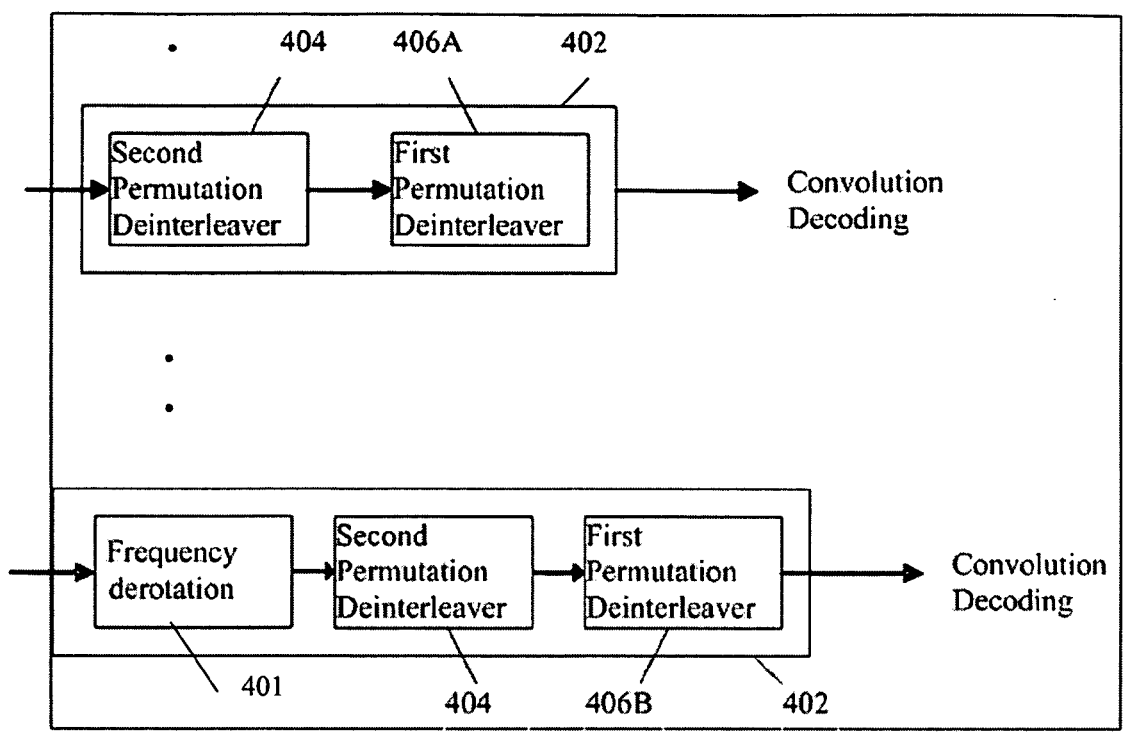
FIG. 4 shows a functional block diagram of an embodiment of an OFDM MIMO receiver including deinterleavers according to the present invention.

Referring to FIG. 4, an example receiver 400 performs the reverse operation, wherein the receiver 400 includes a de-interleaver 402 for each spatial stream for de-interleaving the received bits of each spatial stream according to the present invention. Each deinterleaver 402 comprises a second permutation deinterleaver 404 implementing relation (5) above and first permutation deinterleaver 406A, 406B that perform the inverse of interleaving steps above, restoring the column order for all the data streams and restoring the frequency rotate on all the data streams except the first one.

Example simulations have verified the performance gains of the further improved interleaving process according to the present invention in 20 MHz MIMO channelizations. The coding and modulation modes for the example simulations are listed in table 2.

TABLE 2

Modulation Coding Scheme (MCS) definition in simulation

| Number of spatial streams | Modulation | Coding rate |
|---|---|---|
| 2 | 64-QAM | 3/4 |
| 2 | 16-QAM | 3/4 |

Figure 5A:
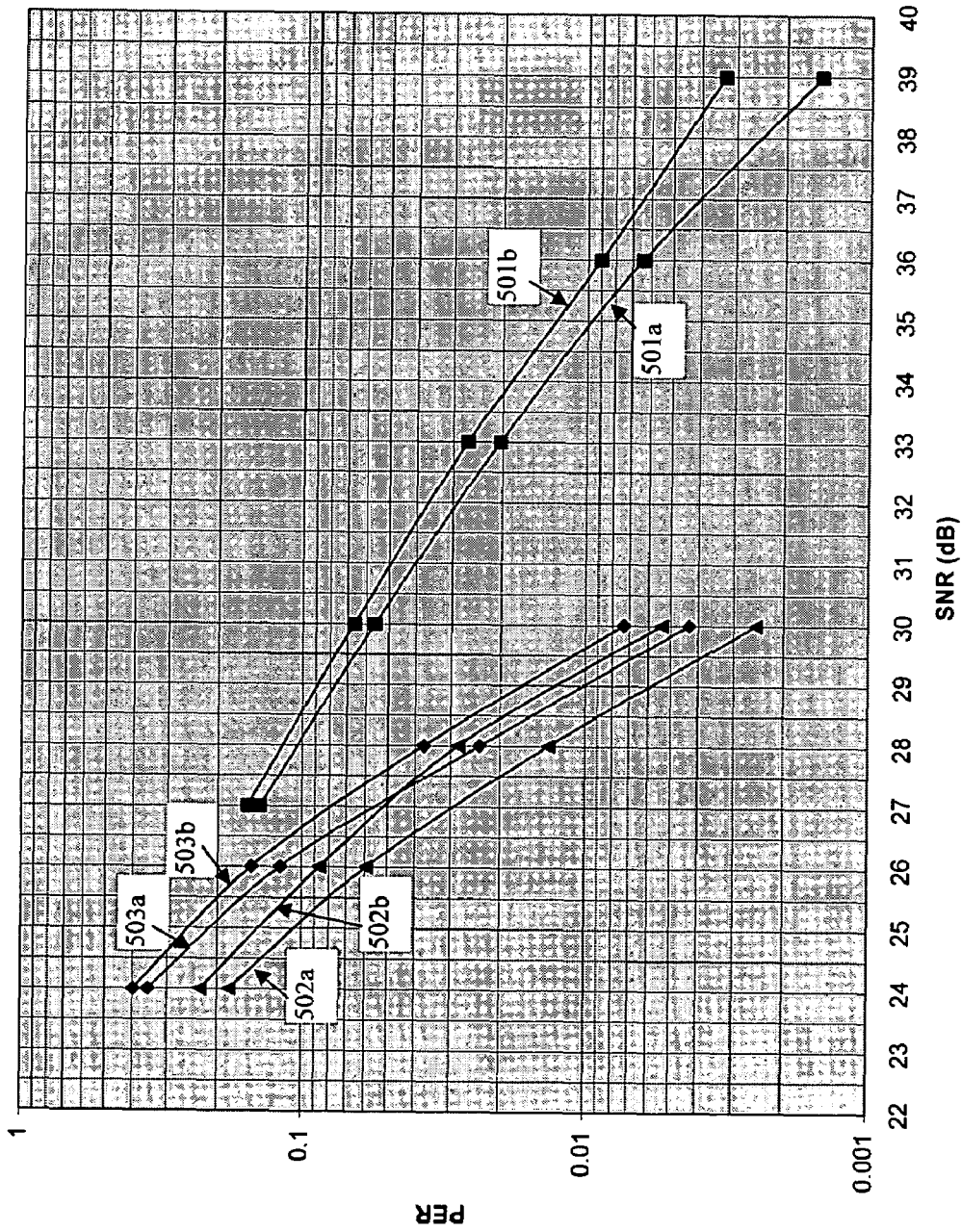
FIGS. 5A-B show example simulation results in 20 MHz channels.

FIG. 5A show example simulation results for IEEE 802.11n channel models BNLOS, DNLOS, and ENLOS, for MCS12, 16 QAM CC3/4 implementations. The curves 501a (for MCS12 BNLOS), 502a (for MCS12 DNLOS) and 503a (for MCS12 ENLOS) show PER vs. SNR performance according to an embodiment of the present invention, and the curves 501b, 502b, 503b show corresponding performance according to other methods.

Figure 5B:
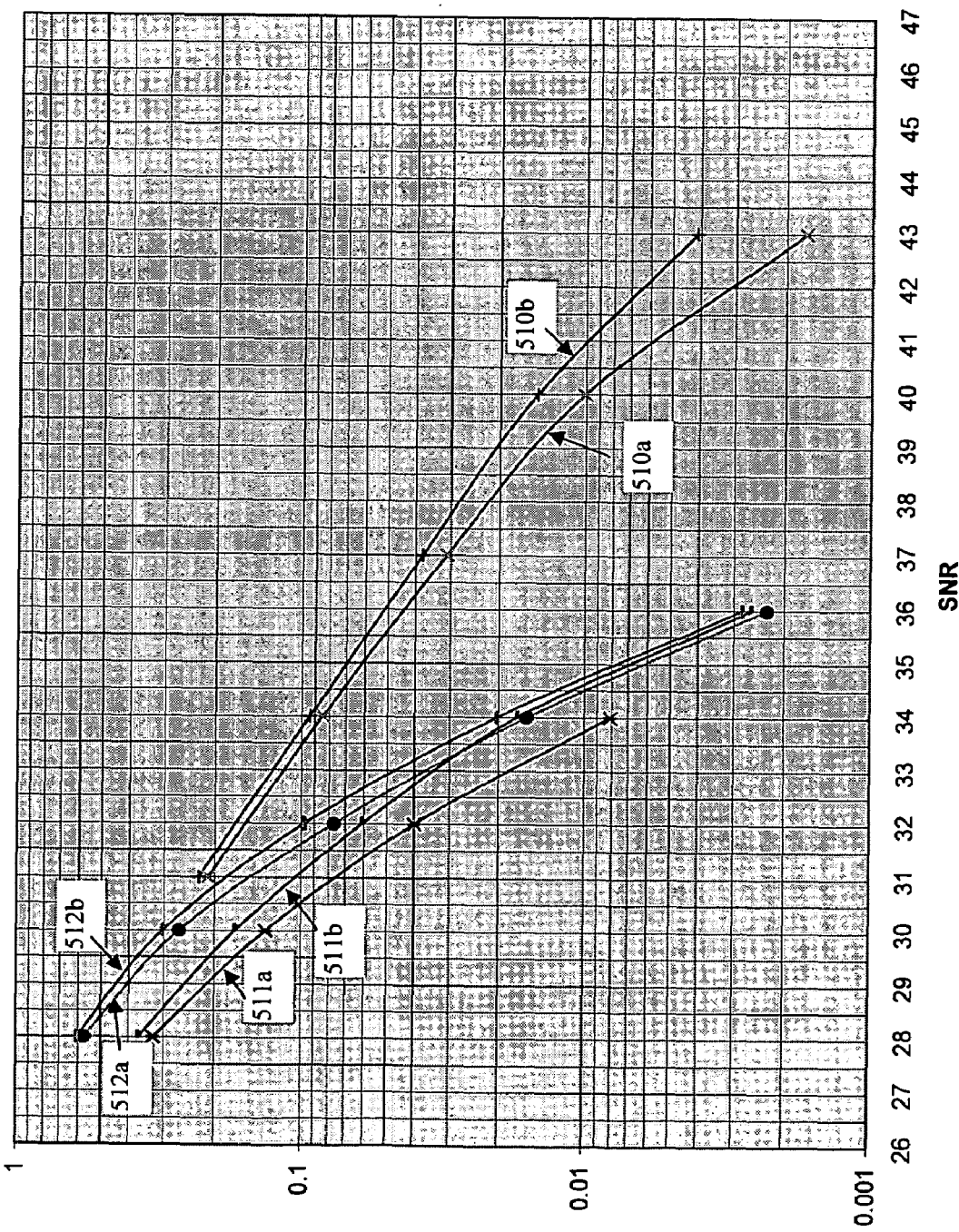

FIG. 5B show example simulation results for IEEE 802.11n channel models BNLOS, DNLOS, and ENLOS, for MCS14, 16 QAM CC3/4 implementations. The curves 510a (for MCS14 BNLOS), 511a (for MCS14 DNLOS) and 512a (for MCS14 ENLOS) show PER vs. SNR performance according to an embodiment of the present invention, and the curves 510b, 511b, 512b show corresponding performance according to other methods. In FIGS. 5A-B, for sake of simplicity of example, perfect synchronization, no RF impairment, and perfect channel estimation is assumed. Further, an MMSE detector is utilized for data stream separation.

Various simulation results show that the further improved example interleaver according to the present invention performs 0.5 to 0.75 dB gain over other interleavers.

Figure 6:
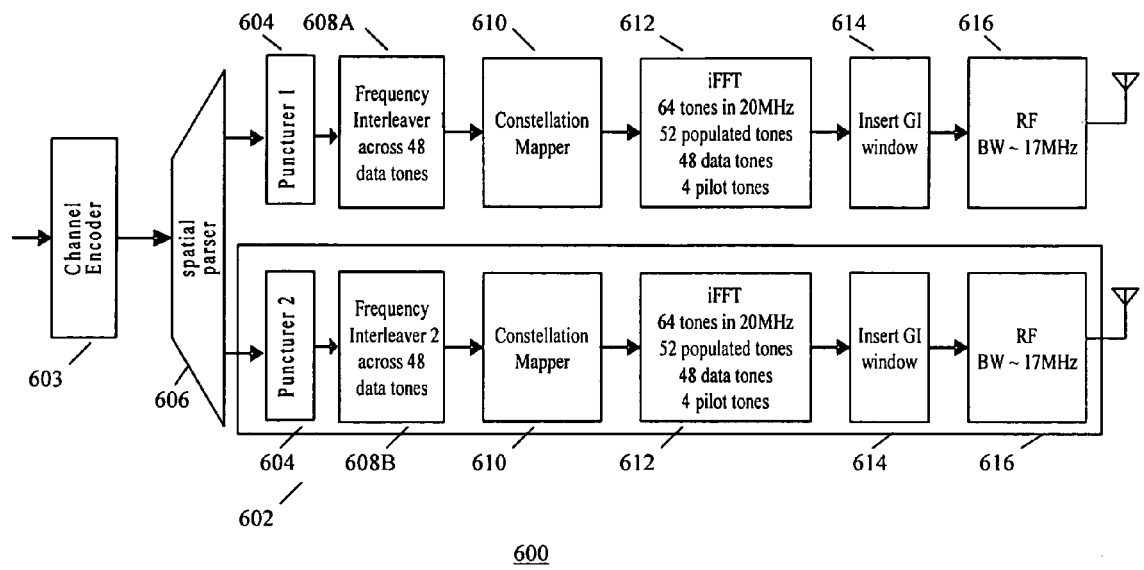
FIG. 6 shows a functional block diagram of an embodiment of an OFDM MIMO transmitter according to another embodiment of the present invention.

An improved interleaving process according to the present invention can be implemented in a modified OFDM MIMO transmitter architecture 600 for a 20 MHz channel is shown in FIG. 6, according to another embodiment of the present invention. Compared to FIG. 1A, in the modified transmitter architecture of FIG. 6, the puncturing processing is performed after the parsing processing. In this case, two puncturers are utilized, one puncturer per data stream processing path. With this modified structure, a MIMO system can transmit data streams with different coding rates simultaneously.

The transmitter 600 includes a channel encoder 603, a spatial parser 606, and two data stream processing paths 602. Each data stream processing path 602 includes a puncturer 604, an interleaver (e.g., interleavers 608A and 608B), a constellation mapper 610, an IFFT function 612, and guard-interval insertion window 614 and an RF modulator 616. For the parser 606 and the interleaver portions (i.e., interleavers 608A, 608B) of the transmitter, coded and punctured bits are interleaved across spatial streams and frequency tones.

As shown, in the transmitter 600, each spatial data stream path includes a puncturer 604, allowing different transmission rates for the two spatial streams (based on the channel conditions). In one example, one puncturer 604 provides a convolutional code 1/2 for a first data stream, and the other puncture 604 provides a convolution code 3/4 for the second data stream. Using multiple puncturers 604 provides more flexibility. For example, where there are two transmitter antennas, if the first antenna provides a better channel than the second antenna, then on the first antenna a high transmission data rate can be achieved, and on the second antenna somewhat lower data transmission rate is achieved. This combination, makes a MIMO OFDM system according to the present invention more flexible and essentially allows optimization of the transmission.

As those skilled in the art will recognize, the example transmitter in FIG. 1B can be similarly modified such that the puncturing processing is performed after the parsing processing, wherein two puncturers are utilized (one puncturer per data stream processing path), much the same way as shown in FIG. 6 and described above.

As those skilled in the art will recognize, other implementations of the present invention are possible, and the present invention is not limited to the example number of frequency rotations and column skip described above. The selected set of parameters is chosen based on the specific number of subcarriers in the 802.11n system. In other systems with different number of subcarriers and parsers, the principles of the present invention can be used while the specific rotation parameters can be different.

The present invention has been described in considerable detail with reference to certain preferred versions thereof; however, other versions are possible. Therefore, the spirit and scope of the appended claims should not be limited to the description of the preferred versions contained herein.

What is claimed is:

1. A method of data communication in a wireless system, comprising the steps of:
    parsing a bit stream into multiple spatial data streams;
    interleaving bits in each spatial data stream by performing a staggered column skip readout operation and frequency rotation on all the data streams except a first data stream, to increase diversity of the wireless system; and
    transmitting the bits of each spatial data stream, wherein the interleaving bits in each spatial data stream by performing the staggered column skip readout operation and frequency rotation further includes reading the bits out from columns 0, k, 1, k+1, 2, k+2, n, k+n, where k is a positive integer selected as the column skip and n is a positive integer.

2. The method of claim 1 wherein the step of interleaving further includes the steps of performing a frequency rotation on the data.

3. The method of claim 2 wherein the step of interleaving further includes the steps of performing a Pulse Amplitude Modulation (PAM) order rotation on the data.

4. The method of claim 3 wherein in the step of interleaving the data bits in an interleaver array are written in by row, and read out by column with a column skip operation.

5. The method of claim 1 wherein the number of columns skip is a function of number of data streams.

6. The method of claim 5 wherein the steps of interleaving the bits in each spatial data stream includes the steps of performing a first interleaving permutation to ensure that adjacent coded bits are mapped onto nonadjacent subcarriers for transmission, and a second interleaving permutation, wherein the first interleaving permutation includes interleaving the bits in each spatial data stream by performing a column skip operation, to increase diversity of the wireless system.

7. The method of claim 1 wherein the wireless system comprises a Multiple Input/Multiple Output (MIMO) system.

8. The method of claim 7 wherein the wireless system comprises an Orthogonal Frequency Division Multiplexing (OFDM) MIMO system.

9. The method of claim 1 further including the steps of puncturing each spatial data stream after the step of parsing.

10. The method of claim 9 wherein the step of puncturing for each spatial data stream is based on the channel condition.

11. A wireless communication system, comprising: a transmitter including:
    a parser that parses a bit stream into multiple spatial data streams;
    multiple interleavers corresponding to the multiple spatial data streams, wherein each interleaver interleaves bits in the corresponding spatial data stream by performing a staggered column skip readout operation on all the data streams and frequency rotation on all the data streams except a first data stream, to increase diversity of the wireless system; and
    a modulator that transmits the bits of each spatial data stream; and a receiver that receives and deinterleaves the transmitted bits,
wherein the interleaving bits in each spatial data stream by performing the staggered column skip readout operation and frequency rotation further includes reading the bits out from columns 0, k, 1, k+1, 2, k+2, n, k+n, where k is a positive integer selected as the column skip and n is a positive integer.

12. The system of claim 11 wherein each interleaver further performs a frequency rotation on the data.

13. The system of claim 12 wherein in each interleaver the data bits are written in the interleaver array by row, and read out by column with a column skip operation.

14. The system of claim 11 wherein each interleaver further performs a Pulse Amplitude Modulation (PAM) order rotation on the data.

15. The system of claim 11 wherein the number of columns skip is a function of the number of data streams.

16. The system of claim 15 wherein each interleaver performs a first interleaving permutation to ensure that adjacent coded bits are mapped onto nonadjacent subcarriers for transmission, and a second interleaving permutation, wherein the first interleaving permutation includes interleaving the bits in each spatial data stream by performing a column skip readout operation, to increase diversity of the wireless system.

17. The system of claim 11 wherein the wireless system comprises a Orthogonal Frequency Division Multiplexing (MIMO) system.

18. The system of claim 17 wherein the wireless system comprises an Orthogonal Frequency Division Multiplexing (OFDM) MIMO system.

19. The system of claim 11 puncturer for puncturing each spatial data stream after the step of parsing.

20. The system of claim 19 wherein puncturing for each spatial data stream is based on the channel condition.

21. A method of data communication in a wireless system, comprising the steps of:
    parsing a bit stream into multiple spatial data streams;
    interleaving bits in each spatial data stream by performing a staggered column skip readout operation and frequency rotation on all the data streams except a first data stream, to increase diversity of the wireless system; and
    transmitting the bits of each spatial data stream, wherein the interleaving bits in each spatial data stream by performing the staggered column skip readout operation and frequency rotation further includes reading the bits out from columns k, 0, k+1, 1, k+2, 2, k+n, n, where k is a positive integer selected as the column skip and n is a positive integer.

22. A wireless communication system, comprising: a transmitter including:
   a parser that parses a bit stream into multiple spatial data streams;
   multiple interleavers corresponding to the multiple spatial data streams, wherein each interleaver interleaves bits in the corresponding spatial data stream by performing a staggered column skip readout operation on all the data streams and frequency rotation on all the data streams except a first data stream, to increase diversity of the wireless system; and
   a modulator that transmits the bits of each spatial data stream; and a receiver that receives and deinterleaves the transmitted bits,
wherein the interleaving bits in each spatial data stream by performing the staggered column skip readout operation and frequency rotation further includes reading the bits out from columns k, 0, k+1, 1, k+2, 2, k+n, n, where k is a positive integer selected as the column skip and n is a positive integer.

23. A method of data communication in a wireless system, comprising:
   employing a processor for:
      parsing a bit stream into multiple spatial data streams;
      interleaving bits in each spatial data stream by performing a staggered column skip readout operation and frequency rotation on all the data streams except a first data stream, to increase diversity of the wireless system; and transmitting the bits of each spatial data stream, wherein the interleaving bits in each spatial data stream by performing the staggered column skip readout operation and frequency rotation further includes reading the bits out non-progressively from columns based on a positive skip integer, wherein the interleaving bits in each spatial data stream by performing the staggered column skip readout operation and frequency rotation further includes reading the bits out from columns 0, k, 1, k+1, 2, k+2, n, k+n, where k is a positive integer selected as the column skip and n is a positive integer.

* * * * *